United States Patent
Yoo

(10) Patent No.: US 9,064,882 B2
(45) Date of Patent: Jun. 23, 2015

(54) PACKAGE SUBSTRATE, MANUFACTURING METHOD THEREOF, AND MOLD THEREFOR

(71) Applicant: SAMSUNG ELECTRO-MECHANICS CO., LTD., Suwon (KR)

(72) Inventor: Zin O Yoo, Suwon (KR)

(73) Assignee: SAMSUNG ELECTRO-MECHANICS CO., LTD., Suwon (KR)

( * ) Notice: Subject to any disclaimer, the term of this patent is extended or adjusted under 35 U.S.C. 154(b) by 0 days.

(21) Appl. No.: 13/827,497

(22) Filed: Mar. 14, 2013

(65) Prior Publication Data

US 2014/0048960 A1 Feb. 20, 2014

(30) Foreign Application Priority Data

Aug. 20, 2012 (KR) .................. 10-2012-0090891

(51) Int. Cl.
*H01L 23/28* (2006.01)
*H01L 21/56* (2006.01)
*H01L 23/31* (2006.01)
*H01L 23/00* (2006.01)

(52) U.S. Cl.
CPC ........... *H01L 21/565* (2013.01); *H01L 23/3114* (2013.01); *H01L 23/3107* (2013.01); *H01L 21/561* (2013.01); *H01L 24/16* (2013.01); *H01L 24/97* (2013.01); *H01L 2224/16225* (2013.01); *H01L 2224/97* (2013.01); *H01L 2924/1815* (2013.01); *H01L 2924/19105* (2013.01)

(58) Field of Classification Search
CPC . H01L 21/565; H01L 23/315; H01L 23/3107; H01L 23/3114

USPC .................................. 257/787; 438/112, 124
See application file for complete search history.

(56) References Cited

U.S. PATENT DOCUMENTS

| | | | |
|---|---|---|---|
| 5,998,243 A | 12/1999 | Odashima et al. | |
| 7,170,153 B2 * | 1/2007 | Saga | 257/678 |
| 8,574,967 B2 * | 11/2013 | Gerber et al. | 438/126 |
| 8,623,706 B2 * | 1/2014 | Haba | 438/122 |
| 2002/0039811 A1 | 4/2002 | Fujisawa | |
| 2003/0001249 A1 * | 1/2003 | Shimanuki | 257/678 |

(Continued)

FOREIGN PATENT DOCUMENTS

| | | |
|---|---|---|
| JP | 2008-053612 | 3/2008 |
| KR | 10-0320776 | 1/2002 |
| KR | 2002-0025669 | 4/2002 |

(Continued)

OTHER PUBLICATIONS

Korean Office Action issued Nov. 12, 2013 in corresponding Korean Application 10-2012-0090891.

*Primary Examiner* — Nathan Ha

(57) ABSTRACT

There are provided a package substrate, a manufacturing method thereof, and a mold therefor. The method of manufacturing a package substrate includes: preparing a chip component and a substrate; mounting the chip component on a main surface of the substrate; preparing a mold having a cavity and protrusions formed on a ceiling surface thereof; disposing the substrate on a bottom surface of the mold such that the chip component is positioned within the cavity; and forming a resin sealing body that collectively hermetically seals the chip component and the main surface of the substrate by injecting a pressurized liquid resin into the cavity.

15 Claims, 5 Drawing Sheets

(56) References Cited

U.S. PATENT DOCUMENTS

| | | | |
|---|---|---|---|
| 2004/0029318 A1* | 2/2004 | Kazama | 438/127 |
| 2006/0216867 A1* | 9/2006 | Kawata et al. | 438/124 |
| 2006/0292750 A1* | 12/2006 | James et al. | 438/118 |
| 2007/0096337 A1 | 5/2007 | Choi | |
| 2009/0189310 A1* | 7/2009 | Takase et al. | 264/272.17 |

FOREIGN PATENT DOCUMENTS

| | | |
|---|---|---|
| KR | 10-0649709 | 11/2006 |
| KR | 10-2008-0074655 | 8/2008 |

\* cited by examiner

PACKAGE SUBSTRATE, MANUFACTURING METHOD THEREOF, AND MOLD THEREFOR

CROSS-REFERENCE TO RELATED APPLICATIONS

This application claims the priority of Korean Patent Application No. 10-2012-0090891 filed on Aug. 20, 2012, in the Korean Intellectual Property Office, the disclosure of which is incorporated herein by reference.

BACKGROUND OF THE INVENTION

1. Field of the Invention

The present invention relates to a package substrate, a manufacturing method thereof, and a mold therefor.

2. Description of the Related Art

Chip components such as a semiconductor chip, or the like, are mounted on a substrate on which electrical circuits are disposed. The semiconductor chips, or the like, mounted on the substrate may be electrically connected to an electrical circuit disposed on the substrate and operated according to a signal.

Meanwhile, as electronic devices have been reduced in size, a substrate mounted therein has also been reduced in size, and accordingly, chip components such as a semiconductor chip, or the like, mounted on a substrate have also had to be reduced in size.

In general, a chip component is electrically connected to a substrate through wire bonding, namely, by soldering a wire, or a chip component is electrically connected to an electrode provided on a substrate by using solder balls, or the like.

The reduction in a size of a chip component makes it difficult to electrically connect the chip component to the substrate. Thus, simple soldering cannot satisfy reliability standards (dropping, MSL, or the like), so a scheme of loading a chip component on a substrate and molding the substrate and the chip component with a resin has been used.

The molding scheme includes a liquid molding scheme of applying a liquid resin and allowing the resin to permeate between chip components by capillary force after an application of a liquid resin, and a transfer molding scheme of injecting a liquid resin at high pressure.

Recently, the transfer molding scheme has been widely utilized due to the productivity, or the like, thereof. In the case of the transfer molding scheme, an air trap is inevitably generated due to a difference in a speed of a flow of a molding solution according to a difference in frictional force between positions (e.g., between a portion of a chip component attached to a substrate and an upper portion of the chip component). Thus, a scheme of compressing the air trap at high pressure to reduce a volume thereof is employed, such that it does not cause a problem in terms of quality.

However, recently, as components have been reduced in size and mounting distances between components have been reduced, the necessity for a technique of further reducing the generation of an air trap and a volume thereof has emerged.

SUMMARY OF THE INVENTION

An aspect of the present invention provides a package substrate for minimizing the generation of an air trap, a mold therefor, and a manufacturing method thereof.

According to an aspect of the present invention, there is provided a method of manufacturing a package substrate, including: preparing a chip component and a substrate; mounting the chip component on a main surface of the substrate; preparing a mold having a cavity and protrusions formed on a ceiling surface thereof; disposing the substrate on a bottom surface of the mold such that the chip component is positioned within the cavity; and forming a resin sealing body that collectively hermetically seals the chip component and the main surface of the substrate by injecting a pressurized liquid resin into the cavity.

An opposite surface of the main surface of the substrate may be in contact with the bottom surface of the mold.

The protrusions may be continuously formed on the ceiling surface.

The protrusions may be formed to be spaced apart from each other at a certain interval in a repetitive manner.

The substrate with the chip component mounted thereon may be disposed on the bottom surface of the mold such that the protrusions correspond to cutting lines of the substrate.

The protrusions may be formed to be longer than a space between the ceiling surface of the mold and the chip component disposed in the cavity and shorter than a space between the ceiling surface of the mold and the substrate disposed in the cavity.

The method may further include cutting the resin sealing body and the substrate, after the forming of the resin sealing body.

The mold may have two opposing lateral surfaces and includes a gate formed on one of the two lateral surfaces and an air vent formed on the other of the two lateral surfaces, and the resin may be injected from the gate toward the air vent.

A fixing unit of the substrate may be provided on the bottom surface of the mold.

The fixing unit may be a mounting recess provided on the bottom surface of the mold, and the substrate may be disposed on the bottom surface of the mold so as to be mounted on the mounting recess.

According to another aspect of the present invention, there is provided a mold for manufacturing a package substrate, the mold including: an upper mold; and a lower mold combined to the upper mold to provide a cavity, wherein the upper mold has protrusions formed on a ceiling surface thereof within the cavity.

The protrusions may be continuously formed on the ceiling surface.

The protrusions may be formed to be spaced apart from each other at a certain interval in a repetitive manner.

The protrusions may be formed to be longer than a space between the ceiling surface of the upper mold and a chip component disposed in the cavity and shorter than a space between the ceiling surface of the upper mold and the substrate disposed in the cavity.

At least one of the upper mold and the lower mold may have two opposing lateral surfaces and include a gate formed on one of the two lateral surfaces and an air vent formed on the other of the two lateral surfaces.

A fixing unit of the substrate may be provided on a bottom surface of the lower mold in the cavity.

The fixing unit may be a mounting recess provided on the bottom surface of the lower mold.

According to another aspect of the present invention, there is provided a package substrate including: a substrate; a chip component mounted on one surface of the substrate; and a resin sealing body hermetically sealing both the chip component and one surface of the substrate, wherein formation protrusions or formation recesses are formed on a main surface of the resin sealing body.

The formation protrusions may be continuously formed on the main surface of the resin sealing body.

The formation recesses may be formed to be spaced apart from each other at a certain interval in a repetitive manner on the main surface of the resin sealing body.

Portions of the resin sealing body where the formation recesses are formed may correspond to cutting lines of the substrate.

The formation recesses may be deeper than a space between an upper surface of the resin sealing body and an upper surface of the chip component sealed in the resin sealing body, and shallower than a space between the upper surface of the resin sealing body and an upper surface of the substrate.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
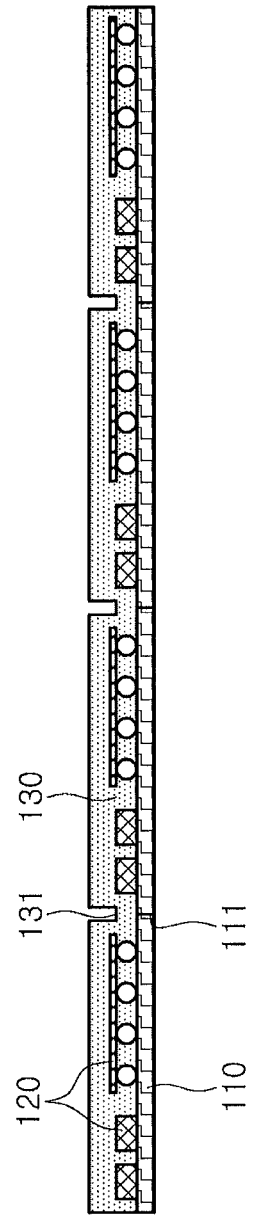
FIGS. 1 and 2 are cross-sectional views of a package substrate according to an embodiment of the present invention.

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Figure 2:
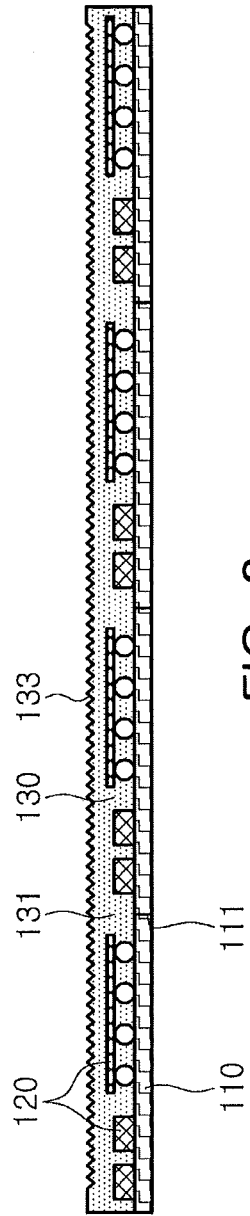

FIGS. 1 and 2 are cross-sectional views of a package substrate according to an embodiment of the present invention.

Referring to FIGS. 1 and 2, package substrates 100 and 200 according to an embodiment of the present invention may include a substrate 110, a chip component 120 such as a semiconductor chip, or the like, mounted on the substrate 110, and a resin sealing body 130 collectively molding the substrate 110 and the chip component 120. Here, a formation recess 131 or a formation protrusion 133 may be provided on a surface of the resin sealing body 130.

The substrate 110 may be a printed circuit board. An electrical circuit is wired on the substrate 110, and the chip component 120 such as a semiconductor chip, or the like, may be mounted on the substrate 110. The chip component 120 may be electrically connected to the electrical circuit wired on the substrate 110. A cutting line 111 may be formed on the substrate 110. Namely, after the chip component 120, or the like, is mounted on the substrate 110 and the molding of the resin sealing body 130 is completed, the substrate 110 may be cut along the cutting line 111. In other words, the substrate 110 is manufactured on a wafer level and cut along the cutting line 111, and each dice may be used.

The chip component 120 such as a semiconductor chip, or the like, may be mounted on one surface of the substrate 110. The chip component 120 may be electrically connected to the substrate 110 through wire bonding, namely, by soldering a wire. Also, the chip component 120 may be electrically connected to an electrode provided on the substrate 110 in a direct flip-chip manner by using solder balls, or the like. Here, the chip component 120 may have a comprehensive concept. Namely, it may include any one that can be mounted on the substrate 110.

The resin sealing body 130 may be provided on the surface of the substrate 110 and the chip component 120 to collectively seal the substrate 110 and the chip component 120. The resin sealing body 130 may formed by disposing the substrate 110 with the chip component 120 mounted thereon within a mold 300 or 400, injecting a liquid resin thereinto, and subsequently removing the mold 300 or 400 after the liquid resin is cured. As the liquid resin, an electrically insulating liquid resin may be used.

Here, the formation recesses 131 or the formation protrusions 133 may be formed on the surface (main surface) of the resin sealing body 130.

The formation recesses 131 may be iteratively formed to be spaced apart at a certain interval in the surface of the resin sealing body 130 (See FIG. 1). The formation recesses 131 may be formed at the same positions as those of the cutting lines 111 provided on the substrate 110. Namely, the formation recesses 131 may serve as guide lines for cutting the substrate 110 into a dice level when the substrate 110 is packaged on a wafer level.

Also, the formation recesses 131 may be deeper than a space between the surface (upper surface) of the resin sealing body 130 and an upper surface of the chip component 120 sealed in the resin sealing body 130, and may be shallower than a space between the surface (upper surface) of the resin sealing body 130 and an upper surface of the substrate 110.

The formation protrusions 133 may be continuously formed on the surface of the resin sealing body 130 (See FIG. 2). Namely, the formation protrusions 133 may be formed as a frictional surface on the surface of the resin sealing body 130 and may have a triangular shape.

The formation recesses 131 and the formation protrusions 133 may be inevitably formed according to the structure of the mold 300 or 400 for minimizing a formation of an air trap within the resin sealing body 130. This will be described in more detail in the molds 300 and 400 and a method of manufacturing a package substrate.

Figure 3A:
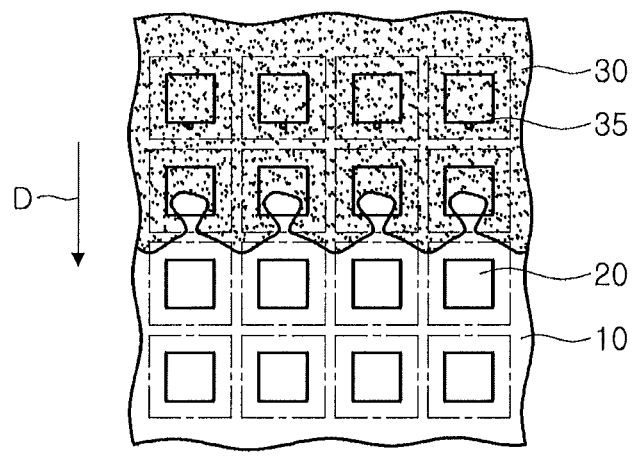
FIGS. 3A and 3B are views illustrating a principle of forming an air trap during a molding process of a package substrate.
Figure 3B:
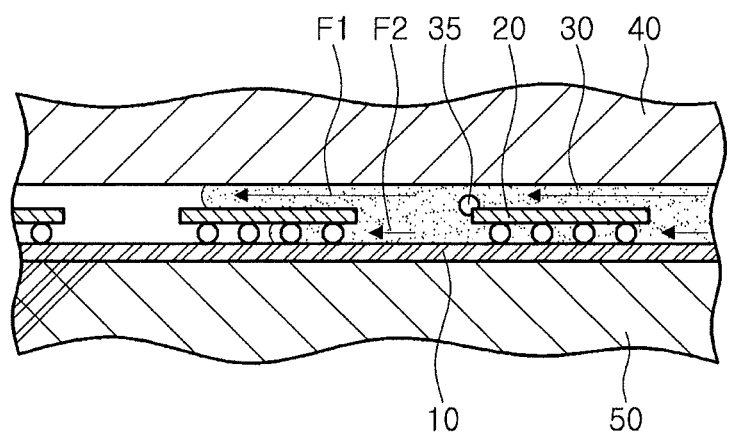

FIGS. 3A and 3B are views illustrating a principle of forming an air trap during a molding process of a package substrate.

Referring to FIG. 3, a substrate 10 with a chip component 20 such as a semiconductor chip, or the like, mounted thereon is disposed in a cavity (internal space) formed by joining (or uniting) an upper mold 40 and a lower mold 50, and a liquid resin is pressurized to be injected into the internal space between the molds 40 and 50 to collectively mold the chip component 20 and the substrate 10 to form a resin sealing body 30.

Within the molds 40 and 50, the liquid resin may be pressured to be injected in a direction of arrows ('D' in FIG. 3A and 'F1' and 'F2' in FIG. 3B). Here, as shown in FIG. 3B, since there is no obstacle between an upper surface of the chip component 20 and the upper mold 40, the liquid resin may be quickly injected thereto (F1), while since obstacles such as a chip component, solder balls, and the like, are disposed between the chip component 20 and the lower mold 50, a flow of the liquid resin is interfered, slowing an injection speed of the liquid resin (F2).

In the case that the upper liquid resin advances, while first filling the upper space, to cover the lower space due to the difference between the injection speeds of the upper and lower liquid resins, an air trap 35 is inevitably formed in the lower space not filled with the liquid resin yet.

Namely, in the case that the substrate with the chip component mounted thereon is disposed in the internal space of the mold and the liquid resin is injected into the internal space to form the resin sealing body, the chip component disposed on the substrate acts as an obstacle interfering with a flow of the liquid resin. Thus, a difference is made between the speeds of the injected liquid resin in the lower space in which the chip component is disposed and the upper space in the internal space of the mold. Namely, in the internal space of the mold, there is a difference in frictional force of the flows of the liquid resin in the lower space in which the chip component is disposed and the upper space.

Thus, in an embodiment of the present invention, the molds 300 and 400 may be configured such that additional frictional force is generated in the upper space in which a chip component is not disposed in the cavity (internal space) formed by the molds 300 and 400, in order to balance the speed of flow of the liquid resin injected into the cavity between the upper space and the lower space. This will be described with reference to FIGS. 4 through 7.

FIGS. 4A to 4D and FIGS. 5A to 5D are views illustrating a manufacturing process of a package substrate according to an embodiment of the present invention.

Referring to FIG. 4, a method of manufacturing the package substrate 100 according to an embodiment of the present invention illustrated in FIG. 1 is disclosed.

Figure 4A:
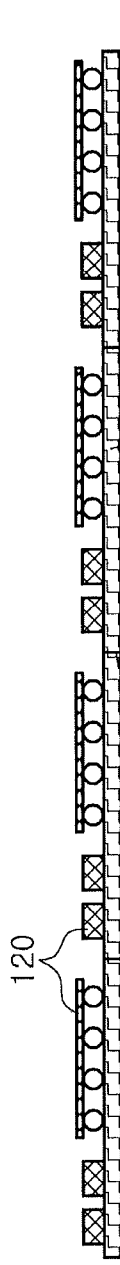
FIGS. 4A to 4D and FIGS. 5A to 5D are views illustrating a manufacturing process of a package substrate according to an embodiment of the present invention.

First, the chip component 120 such as a semiconductor chip, or the like, and the substrate 110 are prepared. And, the chip component 120 is mounted on one surface of the substrate 110 (FIG. 4A). The substrate 110 may be a wafer-level substrate and, in this case, the cutting line 111, along which the substrate 110 is to be cut on a dice level, may be provided on the substrate 110.

Figure 4B:
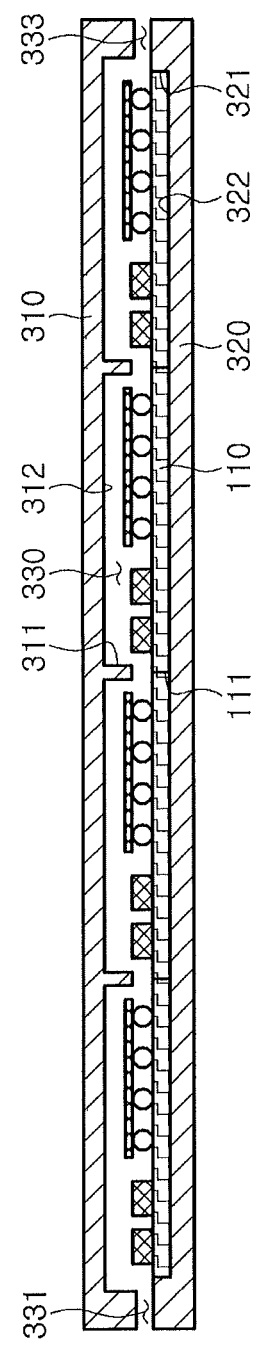

Next, the mold 300 having a cavity 330 and protrusions 311 formed on a ceiling surface 312 is prepared, and the substrate 110 with the chip component 120 mounted thereon is disposed on a bottom surface 322 of the cavity 330 (FIG. 4B).

Here, the chip component 120 may be disposed to be positioned within the cavity 330. Namely, the substrate 110 may be disposed such that an opposite side of a main surface of the substrate 110 is in contact with the bottom surface 322 of the mold 300.

The mold 300 may provide the internal space, i.e., the cavity 330, formed by joining the upper mold 310 and the lower mold 320. Here, the upper mold 310 may provide the ceiling surface 312 of the cavity 330, and the lower mold 320 may provide the bottom surface 322 of the cavity 330.

The protrusions 311 protruded to the cavity 330 may be provided on the upper mold 310. The protrusions 311 provided on the ceiling surface 312 of the upper mold 310 may be spaced apart from each other at a certain interval in a repetitive manner. Meanwhile, the substrate 110 may be disposed in the cavity 330 of the mold 300 such that the cutting lines 111 provided on the substrate 110 correspond to the positions of the protrusions 311.

Figure 4C:
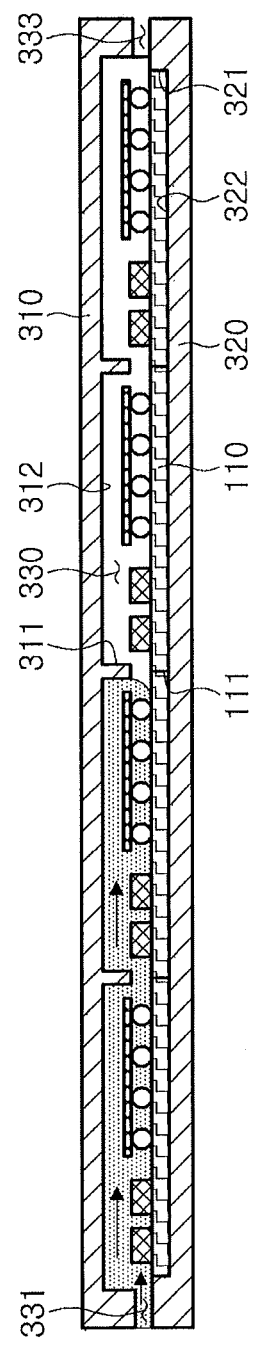

The protrusions 311 may be formed to be longer than the space between the ceiling surface 312 of the mold 300 and the chip component 120 disposed in the cavity 330 and shorter than the space between the ceiling surface 312 of the mold 300 and the substrate 110 disposed in the cavity 330. Namely, when the cavity 330 is divided into the lower space in which the chip component 120, and the like, is disposed and the upper space, the protrusions 311 may be formed to be longer than the height of the upper space. When the protrusions 311 have such a length, a flow of the liquid resin flowing in the upper space can be effectively slowed to effectively minimize the formation of an air trap as shown in FIG. 4C.

The mold 300 may include two opposing lateral surfaces, and have a gate 331 formed on one of the two lateral surfaces and an air vent 333 formed on the other of the two lateral surfaces. The liquid resin may be injected from the gate 331 toward the air vent 333.

A fixing unit of the substrate 110 may be provided on the bottom surface 322 of the mold 300. Namely, the fixing unit may be provided on the bottom surface 322 of the lower mold 320. The fixing unit may be a mounting recess 321 provided on the bottom surface 322 of the lower mold 320, and the substrate 110 may be disposed on the bottom surface 322 so as to be mounted on the mounting recess 321.

The fixing unit may be a suction hole 423 provided on a bottom surface 422 of a lower mold 420. The suction hole 423 may be connected to a suction pump 427 by a suction pipe 425. The substrate 110 may be firmly tightly fixed to the bottom surface 422 of the lower mold 420 by suction force of the suction pump 427 (See FIG. 7).

And then, a liquid resin is pressurized to be injected into the cavity 330 to form the resin sealing body 130 collectively hermetically sealing the chip component 120 and the main surface of the substrate 110 (See FIG. 4C).

The resin sealing body 130 may be an electrical insulator. Also, the resin sealing body 130 may include the formation recesses 131 formed due to the protrusions 311 provided on the upper mold 300. Here, the formation recesses 131 may be formed to be spaced apart from each other at a certain interval in a repetitive manner. Also, the formation recesses 131 may be formed at the same positions as those of the cutting lines 111 provided on the substrate 110.

Figure 4D:
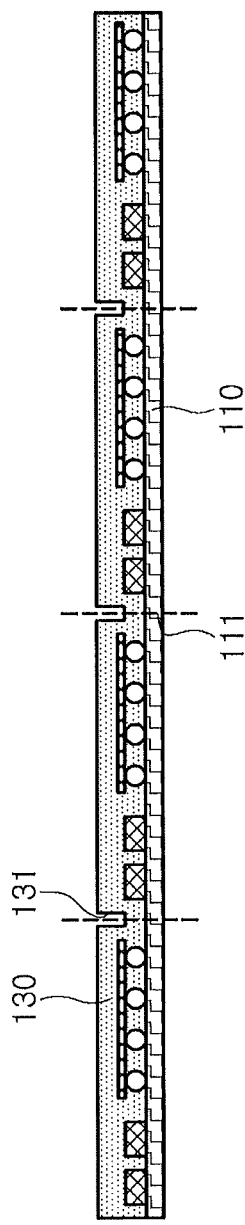

Meanwhile, when the substrate 110 is manufactured on a wafer level, the cutting of the substrate 110 may be included (See FIG. 4D).

Here, since the resin sealing body 130 is formed on an upper portion of the substrate 110, the substrate 110 and the resin sealing body 130 may be simultaneously cut. Also, since the cutting lines 111 are provided on the substrate 110, the substrate 110 may be cut along the cutting lines 111. In addition, when the formation recesses 131 formed on the resin sealing body 130 are formed to correspond to the cutting lines 111, the substrate 110 may be cut by using the formation recesses 131 as cutting guide lines.

Referring to FIG. 5, a method of manufacturing the package substrate 200 according to an embodiment of the present invention illustrated in FIG. 2 is disclosed.

Figure 5A:
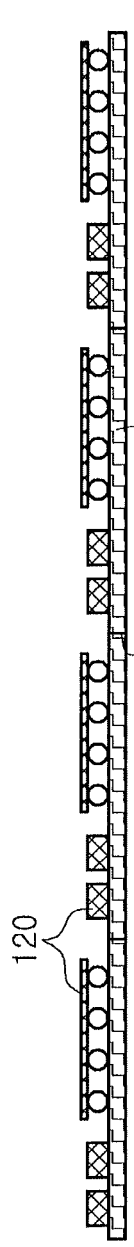

First, the chip component 120 such as a semiconductor chip, or the like, and the substrate 110 are prepared. And, the chip component 120 is mounted on one surface of the substrate 110 (FIG. 5A). The substrate 110 may be a wafer-level substrate and, in this case, the cutting line 111, along which the substrate 110 is to be cut on a dice level, may be provided on the substrate 110.

Figure 5B:
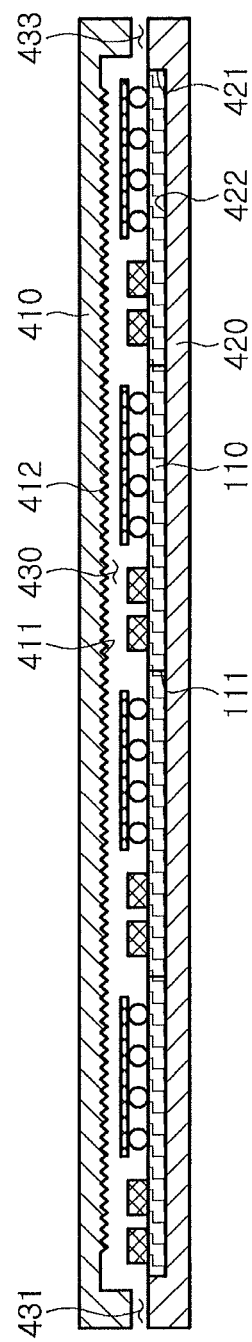

Next, the mold 400 having a cavity 430 and protrusions 411 formed on a ceiling surface 412 is prepared, and the substrate 110 with the chip component 120 mounted thereon is disposed on the bottom surface 422 of the cavity 430 (FIG. 5B).

Here, the chip component 120 may be disposed to be positioned within the cavity 430. Namely, the substrate 110 may be disposed such that an opposite side of a main surface of the substrate 110 is in contact with the bottom surface 422 of the mold 400.

The mold 400 may provide the internal space, i.e., the cavity 430, formed by joining the upper mold 410 and the lower mold 420. Here, the upper mold 410 may provide the ceiling surface 412 of the cavity 430, and the lower mold 420 may provide the bottom surface 422 of the cavity 430.

Also, the protrusions 411 protruded to the cavity 430 may be provided on the upper mold 410. The protrusions 411 provided on the ceiling surface 412 of the upper mold 410 may be continuously provided on the ceiling surface 412.

The protrusions 411 may be formed to additionally provide frictional force in the upper space when the cavity 430 is divided into the lower space in which the chip component 120, and the like, is disposed and the upper space. Namely, since the protrusions 411 are provided on the ceiling surface 412, a flow of the liquid resin flowing in the upper space may be slowed to substantially correspond to the speed of a flow of the liquid resin flowing in the lower space, thus effectively minimizing the formation of an air trap.

The mold 400 may include two opposing lateral surfaces, and have a gate 431 formed on one of the two lateral surfaces and an air vent 433 formed on the other of the two lateral surfaces. The liquid resin may be injected from the gate 431 toward the air vent 433.

A fixing unit of the substrate 110 may be provided on the bottom surface 422 of the mold 400. Namely, the fixing unit may be provided on the bottom surface 422 of the lower mold 420. The fixing unit may be a mounting recess 421 provided on the bottom surface 422 of the lower mold 420, and the substrate 110 may be disposed on the bottom surface 422 so as to be mounted on the mounting recess 421.

Also, the fixing unit may be the suction hole 423 provided on the bottom surface 422 of the lower mold 420. The suction hole 423 may be connected to the suction pump 427 by the suction pipe 425. The substrate 110 may be firmly tightly fixed to the bottom surface 422 of the lower mold 420 by suction force of the suction pump 427 (See FIG. 7).

Figure 5C:
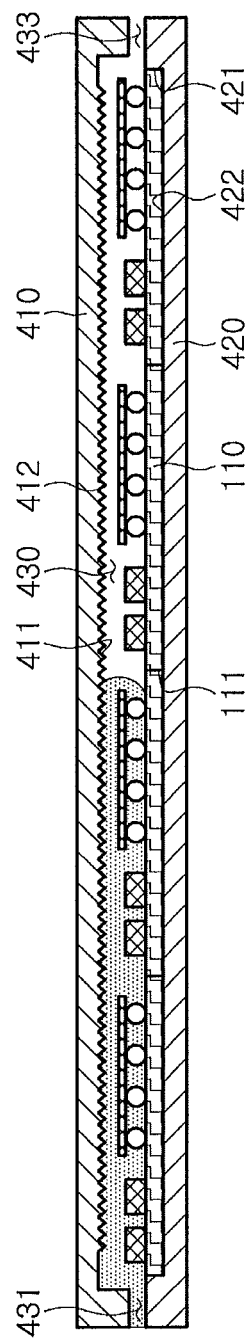

And then, a liquid resin is pressurized to be injected into the cavity 430 to form the resin sealing body 130 collectively hermetically sealing the chip component 120 and the main surface of the substrate 110 (See FIG. 5C).

The resin sealing body 130 may be an electrical insulator. Also, the resin sealing body 130 may include the formation protrusions 133 formed due to the protrusions 411 provided on the upper mold 400. Here, the formation protrusions 133 may be formed to be spaced apart from each other at a certain interval in a repetitive manner.

Figure 5D:
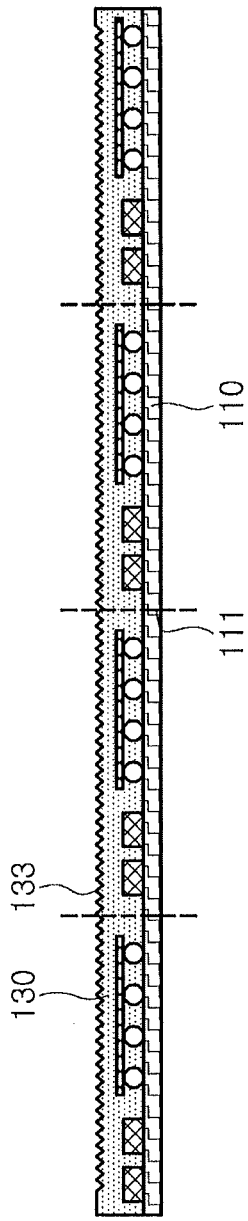

Meanwhile, when the substrate 110 is manufactured on a wafer level, the cutting of the substrate 110 may be included (See FIG. 5D).

Here, since the resin sealing body 130 is formed on an upper portion of the substrate 110, the substrate 110 and the resin sealing body 130 may be simultaneously cut. Also, since the cutting lines 111 are provided on the substrate 110, the substrate 110 may be cut along the cutting lines 111.

Figure 6:
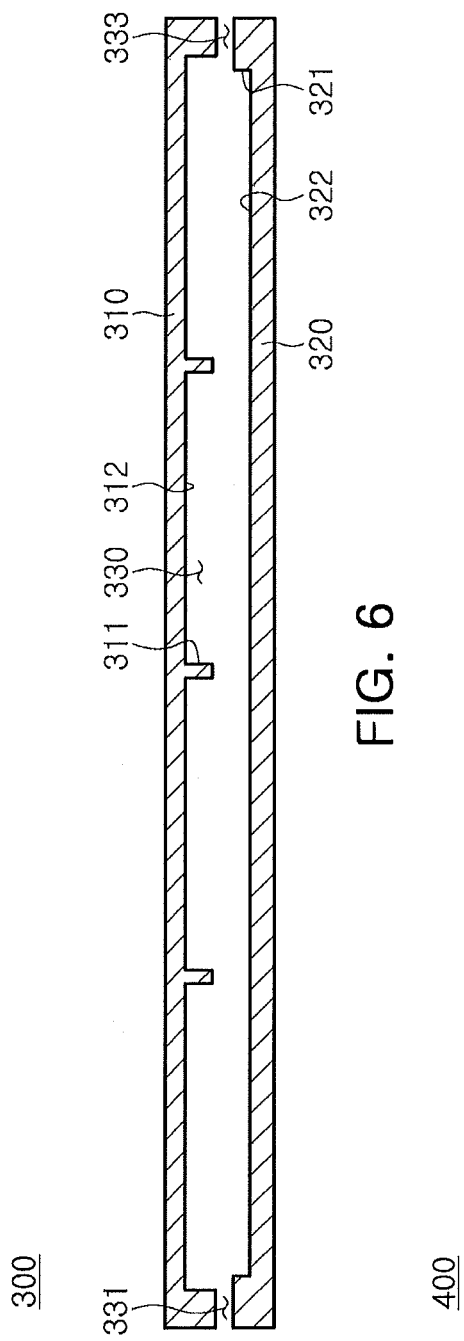
FIGS. 6 and 7 are cross-sectional views illustrating a mold for manufacturing a package substrate according to an embodiment of the present invention.
Figure 7:
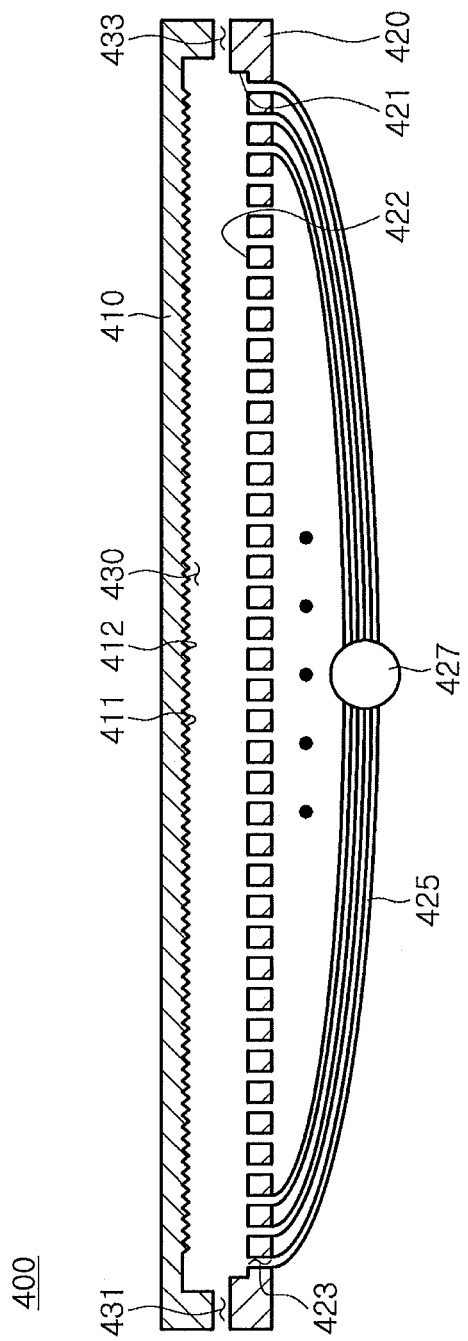

FIGS. 6 and 7 are cross-sectional views illustrating a mold for manufacturing a package substrate according to an embodiment of the present invention.

Referring to FIG. 6, the mold 300 according to the embodiment of the present invention may include the upper mold 310 and the lower mold 320.

The mold 300 may provide the internal space, i.e., the cavity 330, formed by joining the upper mold 310 and the lower mold 320. After the substrate 110 with the chip component 120 such as a semiconductor chip, or the like, mounted thereon is disposed in the cavity 330, a liquid resin is injected to form the resin sealing body 130.

The protrusions 311 may be provided on the ceiling surface 312 of the upper mold 310. The protrusions 311 may be formed to be protrude from the ceiling surface 312 toward the cavity 330. Also, the protrusions 311 may be formed to be spaced apart from each other at a certain interval in a repetitive manner on the ceiling surface 312. In consideration of the cutting lines 111 formed on the substrate 110 disposed in the cavity 330, the protrusions 311 may be provided on the same positions as those of the cutting lines 111.

The protrusions 311 may be formed to be longer than the space between the ceiling surface 312 of the upper mold 310 and the chip component 120 disposed in the cavity 330 and shorter than the space between the ceiling surface 312 of the upper mold 310 and the substrate 110 disposed in the cavity 330. Namely, the size of the protrusions 311 may be determined in consideration of the substrate 110 and the height of the chip component 120 disposed on the substrate 110.

At least one of the upper mold 310 and the lower mold 320 may include two opposing lateral surfaces, and have the gate 331 formed on one of the two lateral surfaces and the air vent 333 formed on the other of the two lateral surfaces. The liquid resin may be injected through the gate 331 and pressurized to be injected from the gate 331 toward the air vent 333.

A fixing unit of the substrate 110 may be provided on the bottom surface 322 of the lower mold 320 in the cavity 330. Namely, the fixing unit firmly fixes the substrate 110 disposed on the bottom surface 322, so even when the liquid resin is injected into the cavity 330, the substrate 110 may not be moved.

Here, the fixing unit may be the mounting recess 321 provided on the bottom surface 322 of the lower mold 320. The mounting recess 321 may be formed to be equal to the size of the substrate 110, allowing the substrate 110 to be substantially press-fit to the mounting recess 321.

Referring to FIG. 7, the mold 400 according to the embodiment of the present invention may include the upper mold 410 and the lower mold 420.

The mold 400 may provide the internal space, i.e., the cavity 430, formed by joining the upper mold 410 and the lower mold 420. After the substrate 110 with the chip component 120 such as a semiconductor chip, or the like, mounted thereon is disposed in the cavity 430, a liquid resin is injected to form the resin sealing body 130.

The protrusions 411 may be provided on the ceiling surface 412 of the upper mold 410. The protrusions 411 may be formed to be protrude from the ceiling surface 412 toward the cavity 430. The protrusions 411 may be continuously repeatedly provided on the ceiling surface 412.

At least one of the upper mold 410 and the lower mold 420 may include two opposing lateral surfaces, and have the gate 431 formed on one of the two lateral surfaces and the air vent 433 formed on the other of the two lateral surfaces. The liquid resin may be injected through the gate 431 and pressurized to be injected from the gate 431 toward the air vent 433.

A fixing unit of the substrate 110 may be provided on the bottom surface 422 of the lower mold 420 in the cavity 430. Namely, the fixing unit firmly fixes the substrate 110 disposed on the bottom surface 422, so even when the liquid resin is injected into the cavity 430, the substrate 110 may not be moved.

Here, the fixing unit may be the suction hole 423 provided on the bottom surface 422 of the lower mold 420. The suction hole 423 may be connected to the suction pump 427 by the suction pipe 425. The substrate 110 may be firmly tightly fixed to the bottom surface 422 of the lower mold 420 by suction force of the suction pump 427.

In addition, the fixing unit may further include the mounting recess 421 provided on the bottom surface 422 of the lower mold 420. The mounting recess 421 may be formed to be equal to the size of the substrate 110, allowing the substrate 110 to be substantially press-fit to the mounting recess 421.

However, the fixing unit is not limited to the foregoing unit and any means may be utilized as long as it can fix the substrate to the bottom surface 422 of the lower mold 420.

As set forth above, according to embodiments of the present invention, a package substrate minimizing the generation of an air trap, a mold therefor and a manufacturing method thereof can be provided.

While the present invention has been shown and described in connection with the embodiments, it will be apparent to those skilled in the art that modifications and variations can be made without departing from the spirit and scope of the invention as defined by the appended claims.

What is claimed is:

1. A method of manufacturing a package substrate, the method comprising:
   preparing a chip component and a substrate;
   mounting the chip component on a main surface of the substrate;
   preparing a mold having a cavity, protrusions formed on a ceiling surface thereof, and two opposing lateral surfaces, the mold including a gate formed on one of the two lateral surfaces and an air vent formed on the other of the two lateral surfaces;
   disposing the substrate on a bottom surface of the mold such that the chip component is positioned within the cavity; and
   forming a resin sealing body that collectively hermetically seals the chip component and the main surface of the substrate by injecting a pressurized liquid resin into the cavity, the resin being injected from the gate toward the air vent, in a direction intersecting that of the protrusions formed on the ceiling surface of the mold,
   the protrusions being longer than a distance of a space between the ceiling surface of the upper mold and a chip component disposed in the cavity and shorter than a distance of a space between the ceiling surface of the upper mold and the substrate disposed in the cavity.

2. The method of claim 1, wherein an opposite surface of the main surface of the substrate is in contact with the bottom surface of the mold.

3. The method of claim 1, wherein the protrusions are continuously formed on the ceiling surface.

4. The method of claim 1, wherein the protrusions are formed to be spaced apart from each other at a certain interval in a repetitive manner.

5. The method of claim 4, wherein the substrate with the chip component mounted thereon is disposed on the bottom surface of the mold such that the protrusions correspond to cutting lines of the substrate.

6. The method of claim 1, further comprising cutting the resin sealing body and the substrate, after the forming of the resin sealing body.

7. The method of claim 1, wherein a fixing unit of the substrate is provided on the bottom surface of the mold.

8. The method of claim 7, wherein the fixing unit is a mounting recess provided on the bottom surface of the mold, and
   the substrate is disposed on the bottom surface of the mold so as to be mounted on the mounting recess.

9. A mold for manufacturing a package substrate, the mold comprising:
   an upper mold; and
   a lower mold combined to the upper mold to provide a cavity,
   wherein the upper mold has protrusions formed on a ceiling surface thereof within the cavity, and at least one of the upper mold and the lower mold has two opposing lateral surfaces and includes a gate formed on one of the two lateral surfaces and an air vent formed on the other of the two lateral surfaces, and
   the protrusions are longer than a distance of a space between the ceiling surface of the upper mold and a chip component disposed in the cavity and shorter than a distance of a space between the ceiling surface of the upper mold and the substrate disposed in the cavity.

10. The mold of claim 9, wherein the protrusions are continuously formed on the ceiling surface.

11. The mold of claim 9, wherein the protrusions are formed to be spaced apart from each other at a certain interval in a repetitive manner.

12. The mold of claim 9, wherein a fixing unit of the substrate is provided on a bottom surface of the lower mold in the cavity.

13. The mold of claim 12, wherein the fixing unit is a mounting recess provided on the bottom surface of the lower mold.

14. The method of claim 1, wherein
   a plurality of chip components are mounted on a main surface of the substrate, and
   in disposing the substrate on a bottom surface of the mold, the chip components are positioned such that at least one of the protrusions protrudes toward a gap between two of the plurality of chip components.

15. The method of claim 14, wherein during the forming of the resin sealing body, the at least one of the protrusions is protruding into the resin to form a recess in the resin sealing body, the method further comprising:
   after the forming of the resin sealing body, cutting the resin sealing body through the recess to separate the two of the plurality of chip components from each other.

* * * * *